(12) United States Patent
Van Rens et al.

(10) Patent No.: US 6,303,860 B1
(45) Date of Patent: Oct. 16, 2001

(54) BLADDER INSERT FOR ENCAPSULANT DISPLACEMENT

(75) Inventors: Russell J. Van Rens, West Allis; Mark J. Skrzypchak, Pleasant Prarie; Gregory C. Hoffman, Watertown, all of WI (US)

(73) Assignee: Bombardier Motor Corporation of America, Grant, FL (US)

( * ) Notice: Subject to any disclaimer, the term of this patent is extended or adjusted under 35 U.S.C. 154(b) by 0 days.

(21) Appl. No.: 09/450,602

(22) Filed: Nov. 30, 1999

(51) Int. Cl.⁷ .................................................. H01L 23/02
(52) U.S. Cl. .......................................... 174/52.4; 257/787
(58) Field of Search ........................ 174/52.2; 257/787; 29/841, 855

(56) References Cited

U.S. PATENT DOCUMENTS 5,689,089 * 11/1997 Polak et al. ........................ 174/52.4

* cited by examiner

*Primary Examiner*—Shawn Riley
(74) *Attorney, Agent, or Firm*—Timothy J. Ziolkowski; Cook & Franke, S.C.

(57) ABSTRACT

An encapsulated device containing a bladder disposed between a wall of the case and the encapsulant. The bladder defines a space devoid of encapsulant, thereby allowing the unimpeded thermal expansion of the encapsulant. By reducing thermal expansion stresses on the encapsulated devices, the reliability of the encapsulated device is improved. The device is formed by installing a component within a case; positioning a bladder within the case; depositing encapsulant with the bladder in an inflated condition; and deflating the bladder.

39 Claims, 3 Drawing Sheets

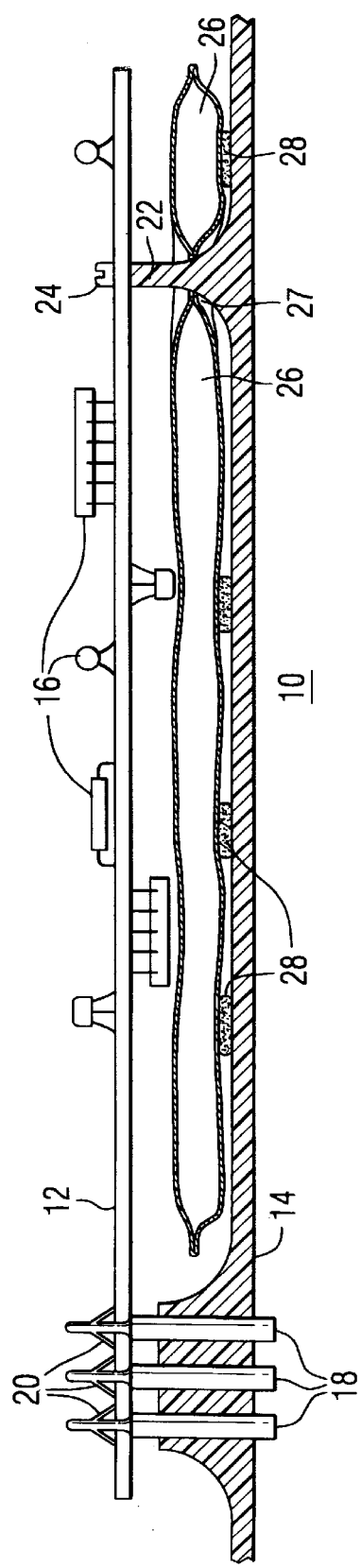
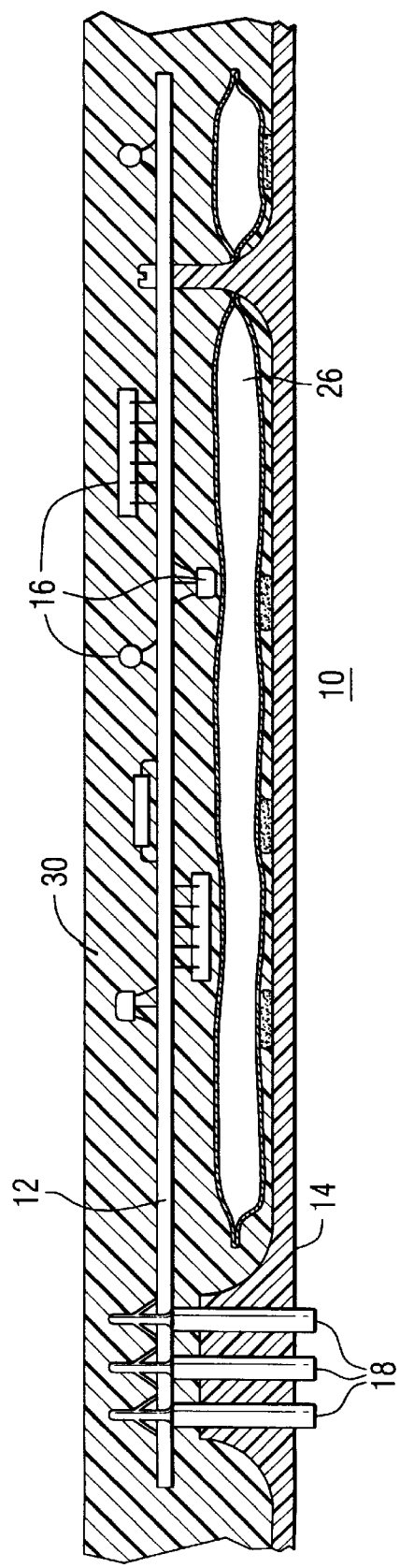
FIG. 1
FIG. 2

BLADDER INSERT FOR ENCAPSULANT DISPLACEMENT

BACKGROUND OF THE INVENTION

This invention relates generally to the field of encapsulated components and to the manufacturing of such components. This invention relates more specifically to the field of electrical components that are encapsulated to improve their resistance to vibration and corrosive environments.

Encapsulation is a process by which a relatively fragile component is surrounded by an encasing material which provides mechanical support to the component and which may seal the component from contact with the ambient environment. Solid state electrical devices are known to be susceptible to printed circuit board failures due to vibration loads and/or mechanical or electrical degradation caused by exposure to a corrosive environment. The assignee of the present invention provides components for the marine environment wherein high levels of vibration and/or corrosive atmospheres may be commonplace. It is known to encapsulate such components to improve their performance in the marine environment. The encapsulant commonly used in such applications is an epoxy resin, selected for its workability, mechanical strength and electrical insulating properties. As commonly practiced, the encapsulant is poured in a fluid state into a case containing electrical devices, then allowed to cure to form a solid mass encasing the electrical devices within the case.

While the known process is effective to protect a component against vibration and environmental damage, failures may occur within the component due to mechanical damage caused by the thermal growth characteristics of the encapsulant. For example, it is known that such thermal growth may cause mechanical failure at the point where a conducting pin is soldered directly to a mating connector on a printed circuit board when the pin is fully constrained by being molded into a plastic case. Encapsulant disposed between the printed circuit board and the case is subject to thermal expansion and contraction. The thermal growth of the encapsulant may tend to move the printed circuit board away from the case. However, at the location of the soldered connection, the printed circuit board is maintained at a fixed distance from the case. The thermal expansion of the encapsulant may impose unacceptably high forces on the printed circuit board and/or the soldered connection. Encapsulated electrical components are known to have failed as the result of such differential thermal expansion.

BRIEF SUMMARY OF THE INVENTION

Thus, there is a particular need for an improved method for encapsulating a component to avoid failures resulting from the thermal growth of the encapsulant. There is also a particular need for an encapsulated component having a greater resistance to thermal growth failures.

Described herein is a method for encapsulating components within a case, the method comprising the steps of: positioning a bladder within the case; installing at least one component within a case; depositing an encapsulant in a fluid state within the case and allowing the encapsulant to transform to a solid state with the bladder in an inflated condition; and deflating the bladder. A product formed by such a process is also described herein, as well as a kit to be used for encapsulating a component by the described process.

BRIEF DESCRIPTION OF THE DRAWINGS

The features and advantages of the present invention will become apparent from the following detailed description of the invention when read with the accompanying drawings in which:

FIG. 1 is a partial sectional view of a printed circuit board mounted within a case proximate an inflated bladder.

FIG. 2 is a partial sectional view of the apparatus of FIG. 1 after being encased within an encapsulant.

Identical components illustrated on successive drawings are identified with the same numeral in each drawing.

DETAILED DESCRIPTION OF THE INVENTION

Figure 3:
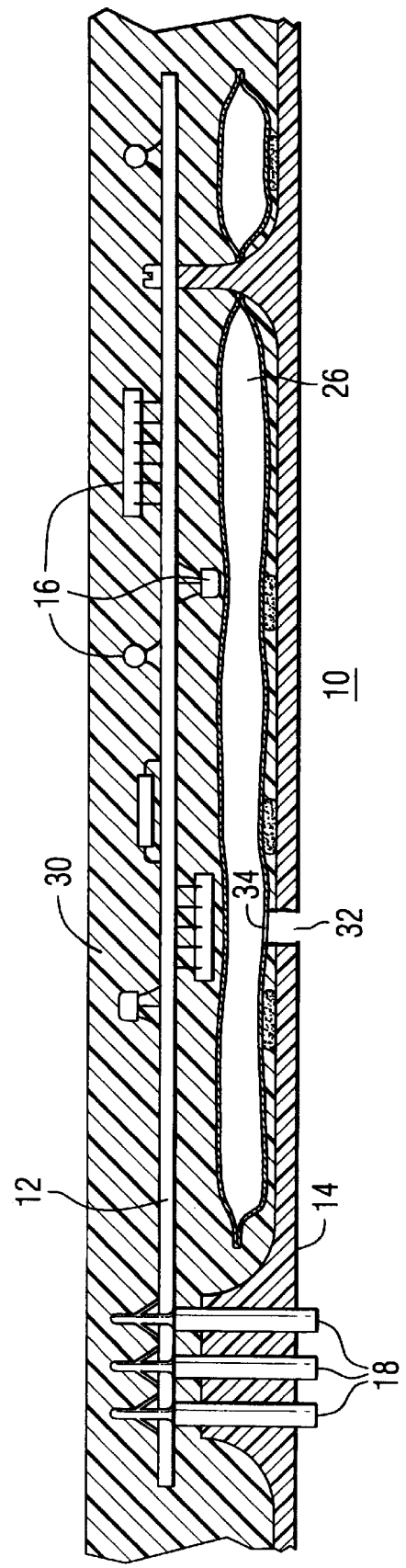
FIG. 3 is a partial sectional view of the apparatus of FIG. 2 wherein the bladder has been punctured by drilling a hole through the case.

The applicants have discovered a method and apparatus for accommodating the thermal growth of an encapsulant disposed within a case. In the embodiment illustrated in FIGS. 1–3 an electrical printed circuit board is encapsulated within a case. The apparatus 10 includes a printed circuit board 12 housed within a case 14. As is known in the art, case 14 may be a one piece injection molded plastic component, a partial bottom wall of which is illustrated in FIG. 1. A plurality of electrical devices 16 are mounted to printed circuit board 12. The electrical devices 16 may constitute all or part of a circuit, such as for example, circuitry necessary to perform the function of a power supply. Electrical connection to the circuit board 12 is provided by one or more conductive pins 18. The pins 18 may be sealed within the wall of the case 14 as is known in the art of injection molding. Each pin is illustrated as being soldered to a connector 20 mounted on circuit board 12, thereby providing both mechanical and electrical connections between the case 14 and the circuit board 12. Circuit board 12 may also be supported mechanically by post 22 formed as an integral portion of the wall of case 14. A screw 24 is shown attaching the circuit board 12 to post 22.

Figure 4:
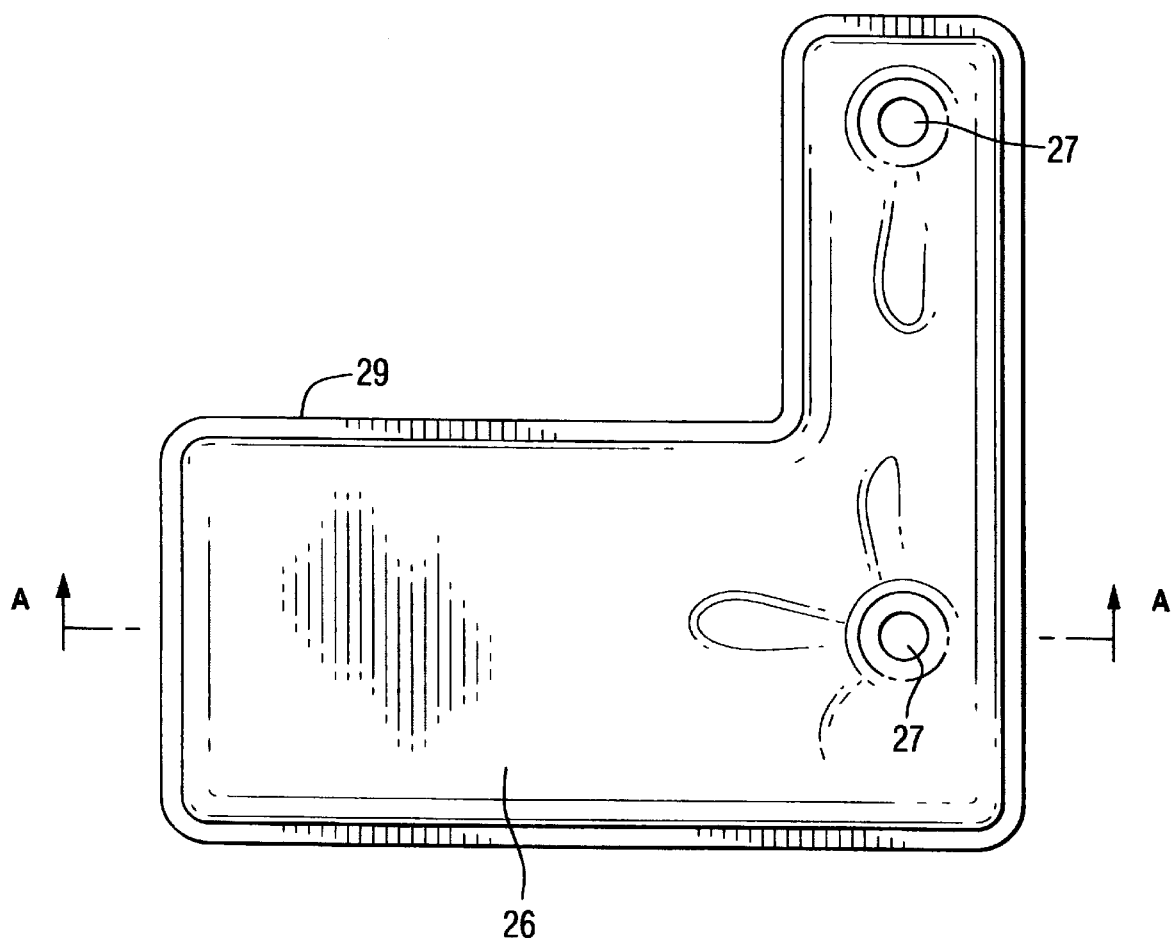
FIG. 4 is a top view of the bladder of FIGS. 1–3.

A bladder 26 is positioned within the case 14, and may be attached to a surface of the case by an adhesive 28. Bladder 26 is a hollow structure defined by a flexible wall member which takes a predetermined shape when inflated to an internal pressure that is higher than the ambient external pressure. The bladder may be formed of a flexible, airtight material, such as polyvinylchloride (PVC). Other materials of construction for the bladder 26 may be selected for ease of manufacturing, electrical insulation properties, resistance to heat, and/or compatibility with the encapsulant material to be used. In the embodiment of FIG. 1, bladder 26 consists of two layers of PVC material sealed on their respective edges 28 by a thermal sealing process. Bladder 26 is also illustrated as having a sealed hole 27 formed in one location for fitting around post 22. Such a hole 27 may be seen more clearly in FIG. 4 which is a top view of bladder 26. FIG. 4 also illustrates the location of a section A—A which is the sectional view of the bladder 26 seen in FIGS. 1–3. Bladder 26 may be formed in any desired shape, and it preferably will conform to the geometry of at least a portion of the interior of case 14. The shape of bladder 26 is selected to match the shape of a desired space within case 14 devoid of encapsulant, as will be described more fully below. The interior of bladder 26 may be filled with air or other fluid so that the bladder takes a predetermined shape when inflated. The bladder 26 may be inflated prior to being installed within the case 14, or for certain applications, it may be installed in a deflated state and inflated once it is in position within the case 14.

FIG. 2 illustrates the apparatus 10 of FIG. 1 after encapsulant 30 has been deposited in the case 14. Prior to depositing the encapsulant 30, the printed circuit board 12, electrical devices 16 and case 14 may be preheated to a predetermined elevated temperature for a period of time sufficient to remove moisture from the components. Encapsulant 30 in a fluid state is then poured into the case 14 to a predetermined level. In certain embodiments, it may be necessary to tilt the case 14 and enclosed components while introducing the encapsulant 30 in order to avoid the entrapment of air under the circuit board 12, thereby ensuring the complete encapsulation of all of the devices 16. In the embodiment of FIGS. 1–3, bladder 26 is positioned so that it does not contact any portion of the printed circuit board 12. This insures that the encapsulant 30 will fully encase the electrical devices 16 located on the side of the circuit board 12 proximate the bladder 26. Encapsulant 30 is allowed to cure to transform to a solid state with the bladder 26 in its inflated condition, thereby forming a space devoid of encapsulant 30 at a desired location within the case 14.

FIG. 3 illustrates the apparatus 10 of FIGS. 1–2 with a hole 32 having been drilled through case 14, thereby causing a puncture 34 in bladder 26. The puncture 34 allows the interior of bladder 26 to be in fluid communication with and at pressure equilibrium with the ambient environment of the apparatus 10. As encapsulant 30 grows due to an increase in temperature, the space defined by the bladder 26 which is devoid of encapsulant 30 may decrease to accommodate the thermal expansion of the encapsulant 30. Without the puncture 34, the deformation of encapsulant 30 and resulting decrease in volume of the space devoid of encapsulant may result in an undesirable increase in pressure in bladder 26, thereby negating the desired affect of providing space for the unimpeded thermal growth of encapsulant 30. Because the encapsulant 30 is free to grow into the space defined by bladder 26, the stresses generated in the printed circuit board and attached structures are reduced. The material of bladder 26 is selected so that it remains flexible during the operation of the apparatus 10 and so that it may remain within the apparatus 10 throughout its operating life without detrimental effect.

In lieu of drilling a hole 32 or otherwise penetrating the case 14 in order to form puncture 34, the puncture 34 may be formed by cutting off a portion of bladder 6 extending above the top level of encapsulant 30. Alternatively, a valve may be attached to the wall of bladder 26 and made accessible outside the area of the encapsulant 30. Once the encapsulant 30 has transformed to a solid state, the valve may be opened to provide a fluid communication path between the interior of the bladder 26 and the ambient environment.

The bladder 26 and encapsulant 30 may be supplied together with a fully assembled apparatus 10, or they may be supplied separately as a kit for installation subsequent to the assembly of the circuit board 12 and case 14. Such a kit may include a bladder 26 shaped to fit within the case 14, along with a supply of encapsulant 30. The kit may also include a supply of adhesive 28, such as a tube of liquid adhesive, for securing the bladder 26 in its proper position while the encapsulant 30 is poured into case 14.

While the preferred embodiments of the present invention have been shown and described herein, such embodiments are provided by way of example only. Numerous variations, changes and substitutions will occur to those of skill in the art without departing from the invention herein. For example, the embodiment illustrated in FIGS. 1–3 is for an electrical printed circuit board component. Other embodiments may include, for example, discreet electrical components, mechanical devices, sensors, or fragile containers, etc. mounted in a case. Accordingly, it is intended that the invention be limited only by the spirit and scope of the appended claims.

We claim as our invention:

1. A method of encapsulating components within a case, the method comprising the steps of:
    positioning a bladder within a case;
    installing at least one component within the case;
    depositing an encapsulant in a fluid state within the case and allowing the encapsulant to transform to a solid state with the bladder in an inflated condition; and
    deflating the bladder.

2. The method of claim 1, wherein the step of positioning further comprises attaching the bladder to a surface of the case with an adhesive.

3. The method of claim 1, wherein the step of positioning further comprises positioning the bladder not to contact any portion of the at least one component when in its inflated condition.

4. The method of claim 1, wherein the step of deflating the bladder further comprises puncturing the bladder.

5. The method of claim 1, wherein the step of deflating the bladder further comprises penetrating the case to puncture the bladder.

6. The method of claim 1, wherein the step of installing further comprises:
    positioning a circuit board within the case; and
    soldering a connector mounted on the circuit board to a pin attached to the case.

7. The method of claim 1, wherein the step of installing further comprises:
    positioning a circuit board within the case;
    attaching a portion of the circuit board to the case.

8. The method of claim 1, further comprising:
    attaching the bladder to a bottom surface of the case;
    mounting a circuit board in the case above the bladder; and
    tilting the case while pouring the encapsulant into the case to ensure that the encapsulant flows between the bladder and the circuit board.

9. The method of claim 1, further comprising the steps of forming the bladder to have a predetermined shape and positioning the bladder in a predetermined location within the case so that a space created when the bladder is deflated has a predetermined shape and location relative to the case and the at least one component.

10. The method of claim 1, further comprising the steps of heating the at least one component, bladder and case to a predetermined temperature and maintaining that temperature for a predetermined length of time prior to the step of depositing an encapsulant.

11. A method of encapsulating components within a case, the method comprising the steps of:
    positioning a bladder within a case;
    installing at least one component within the case; and
    depositing an encapsulant in a fluid state within the case and allowing the encapsulant to transform to a solid state with the bladder forming a space devoid of encapsulant between the component and the case.

12. The method of claim 11, wherein the step of positioning further comprises attaching the bladder to a surface of the case with an adhesive.

13. The method of claim 11, wherein the step of positioning further comprises positioning the bladder not to contact any portion of the at least one component.

14. The method of claim 11, wherein the step of installing further comprises:
   positioning a circuit board within the case; and
   soldering a connector mounted on the circuit board to a pin attached to the case.

15. The method of claim 11, wherein the step of installing further comprises:
   positioning a circuit board within the case;
   attaching a portion of the circuit board to the case.

16. The method of claim 11, further comprising:
   attaching the bladder to a bottom surface of the case;
   mounting a circuit board in the case above the bladder; and
   tilting the case while pouring the encapsulant into the case to ensure that the encapsulant flows between the bladder and the circuit board.

17. The method of claim 11, further comprising the steps of forming the bladder to have a predetermined shape and positioning the bladder in a predetermined location within the case so that the space devoid of encapsulant has a predetermined shape and location relative to the case and the at least one component.

18. The method of claim 11, further comprising the steps of heating the at least one component, bladder and case to a predetermined temperature and maintaining that temperature for a predetermined length of time prior to the step of depositing an encapsulant.

19. A product formed by the process of:
   positioning a bladder within a case;
   installing at least one component within the case;
   depositing an encapsulant in a fluid state within the case and allowing the encapsulant to transform to a solid state with the bladder in an inflated condition; and
   deflating the bladder.

20. The product of claim 19, formed by the further step of positioning the bladder not to contact any portion of the at least one component when in its inflated condition.

21. The product of claim 19, formed by the further steps of:
   positioning a circuit board within the case; and
   soldering a connector mounted on the circuit board to a pin attached to the case.

22. The product of claim 19, formed by the further steps of:
   attaching the bladder to a bottom surface of the case;
   mounting a circuit board in the case above the bladder;
   tilting the case while pouring the encapsulant into the case to ensure that the encapsulant flows between the bladder and the circuit board.

23. A product formed by the process of:
   positioning a bladder within a case;
   installing at least one component within the case; and
   depositing an encapsulant in a fluid state within the case and allowing the encapsulant to transform to a solid state with the bladder in an inflated condition, such that a space of the bladder devoid of encapsulant decreases to accommodate thermal expansion of the encapsulant.

24. The product of claim 23, formed by the further step of positioning the bladder not to contact any portion of the at least one component.

25. The product of claim 23, formed by the further steps of:
   positioning a circuit board within the case; and
   soldering a connector mounted on the circuit board to a pin attached to the case.

26. The product of claim 23, formed by the further steps of:
   attaching the bladder to a bottom surface of the case;
   mounting a circuit board in the case above the bladder;
   tilting the case while pouring the encapsulant into the case to ensure that the encapsulant flows between the bladder and the circuit board.

27. An apparatus comprising:
   a case;
   an electrical component disposed within the case;
   encapsulate disposed within the case and in contact with at least one surface of the electrical component;
   a bladder disposed within the case.

28. The apparatus of claim 27, wherein the electrical component comprises a circuit board, and further comprising:
   a pin sealingly attached to and extending into the case; and
   a soldered connection between the pin and a portion of the circuit board.

29. The apparatus of claim 27, wherein the interior of the bladder is in fluid communication with the ambient environment of the apparatus.

30. The apparatus of claim 27, further comprising a puncture in the bladder.

31. The apparatus of claim 27, further comprising a hole in the case proximate the puncture.

32. The apparatus of claim 27, wherein the bladder comprises a PVC material.

33. A kit for encapsulating a component within a case, the kit comprising:
   a bladder shaped to fit within a case proximate a component; and
   encapsulant for at least partially filling the interior of the case to be in contact with the component and the bladder.

34. The kit of claim 33, wherein the bladder comprises a PVC material.

35. The kit of claim 33, further comprising an adhesive for attaching the bladder to a wall of the case.

36. An apparatus comprising:
   a case;
   an electrical component disposed within the case;
   a bladder disposed within the case; and
   an encapsulant disposed within the case and in permanent contact with the bladder.

37. The apparatus of claims 36 wherein thermal expansion of the encapsulant causes an inner space of the bladder devoid of encapsulant to decrease.

38. The apparatus of claim 37 wherein the encapsulant remains in contact with the bladder during thermal expansion of the encapsulant.

39. The apparatus of claim 37 wherein the bladder inversely mirrors one of expansion and contraction of the encapsulant.

* * * * *